United States Patent
Ekberg et al.

(10) Patent No.: US 7,488,957 B2
(45) Date of Patent: Feb. 10, 2009

(54) PATTERN GENERATION METHODS AND APPARATUSES

(75) Inventors: Peter Ekberg, Lidingö (SE); John-Oskar Larsson, Järfälla (SE)

(73) Assignee: Micronic Laser Systems AB, Taby (SE)

( * ) Notice: Subject to any disclaimer, the term of this patent is extended or adjusted under 35 U.S.C. 154(b) by 172 days.

(21) Appl. No.: 11/206,197

(22) Filed: Aug. 18, 2005

(65) Prior Publication Data

US 2006/0027538 A1    Feb. 9, 2006

Related U.S. Application Data

(63) Continuation-in-part of application No. PCT/SE2004/000233, filed on Feb. 20, 2004.

(30) Foreign Application Priority Data

Feb. 20, 2003    (SE)    .................................... 0300453

(51) Int. Cl.
*A61N 5/00*    (2006.01)
(52) U.S. Cl. .............. 250/492.2; 250/492.1; 250/522.1; 250/526
(58) Field of Classification Search ... 250/492.1–492.3, 250/522.1, 491.1, 526
See application file for complete search history.

(56) References Cited

U.S. PATENT DOCUMENTS 4,063,103 A * 12/1977 Sumi ............................ 372/3
4,445,485 A    5/1984 Chamness, Jr.
5,495,279 A *   2/1996 Sandstrom .................. 347/258
6,816,302 B2 * 11/2004 Sandstrom et al. .......... 359/291
6,886,154 B2 *  4/2005 Okuyama ..................... 716/21
7,001,481 B2 *  2/2006 Sandhu et al. ............ 156/345.5

FOREIGN PATENT DOCUMENTS

DE          40 22 732 A1    2/1992
WO    WO 2004/074940 A1    2/2004

OTHER PUBLICATIONS

International Search Report (PCT/ISA/210).
International Preliminary Examination Report (PCT/IPEA/409).
Written Opinion (PCT/IPEA/408).

* cited by examiner

*Primary Examiner*—Jack I Berman
*Assistant Examiner*—Andrew Smyth
(74) *Attorney, Agent, or Firm*—Harness, Dickey & Pierce, P.L.C.

(57) ABSTRACT

A method may comprise emitting electromagnetic radiation onto a workpiece and storing data describing geometrical elements in a pattern. The electromagnetic radiation may be focused and/or reflected in a first direction, and a power level of the electromagnetic radiation may be modulated according to the stored data. A guiding rail may be moved in the first direction and a carriage may be moved in a second direction, each in one of a continuous and stepwise manner. The second direction may be substantially perpendicular to the first direction. A pattern may be exposed on the workpiece.

20 Claims, 3 Drawing Sheets

PATTERN GENERATION METHODS AND APPARATUSES

PRIORITY STATEMENT

This non-provisional U.S. application is a continuation-in-part under 35 U.S.C. § 111(a) of PCT International Application No. PCT/SE2004/000233, which has an international filing date of Feb. 20, 2004, which designated the United States of America, and which claims priority under 35 U.S.C. § 119 of Swedish Patent Applicant No. 0300453-8, filed on Feb. 20, 2003, the entire contents of both of which are hereby incorporated by reference.

BACKGROUND OF THE INVENTION

1. Field of the Invention

Example embodiments of the present invention relate to methods and apparatuses for exposing a workpiece and/or the formation of patterns thereon using, for example, laser lithography on substrates such as boards (e.g., printed circuit boards (PCBs) or flexible PCBs), artworks, masks for liquid crystal displays (LCD), plasma display panels (PDP), thin film transistor displays (TFT), etc.

2. Description of the Conventional Art

In conventional methods for manufacturing masks, a pattern may be exposed in a photo resist, for example, an opaque film (e.g., chromium) on a transparent substrate (e.g., quartz). In a conventional develop and etch process the resist in the exposed areas may be removed and the unprotected film may be dissolved by an etchant (e.g., chromium etchant). As a result, a glass plate with an opaque pattern (e.g., opaque chromium) may be used as an optical contact and/or projection mask for production of, for example, a conductor pattern on glass plates of an LCD, PDP, TFT and/or any other suitable display. The glass plates may be coated with a photo resist or emulsion and exposed through the optical mask (e.g., optical chromium mask). In conventional methods of manufacturing a mask, patterns of increasing complexity may be written on the mask and the glass plates may be reproduced.

Active matrix displays may require writing of elements of, for example, 600 nm, which may require a geometrical error on the order of about 0.03 parts per million (pap) or, for example, about 40 nm in the smaller direction of a 1900×1200 mm plate.

Conventional exposure tools for creating larger displays (e.g., "flat panel" displays), for example, as discussed in U.S. Pat. No. 5,495,279, the entire contents of which are incorporated herein by reference, may have a stage moving in an x and/or y-direction under a fixed or a moving writing head, and may be operated in an environment (e.g., a particle free environment) where the floor space may be increasingly expensive.

SUMMARY OF THE INVENTION

One or more example embodiments of the present invention provide methods for exposing plates used in displays, for example, without creating a mask. One or more example embodiments of the present invention also provide exposure tools with reduced volume, which may control and/or stabilize a temperature of a writing chamber. One or more example embodiments of the present invention provide exposure tools, which provide higher quality and/or more accurate critical dimension control of a printed pattern.

One or more example embodiments of the present invention provide an apparatus, which may be more economical during manufacture, transport and/or operation.

In a method according to an example embodiment of the present invention, electromagnetic radiation may be emitted onto a workpiece, and data describing geometrical elements in a pattern may be stored. The electromagnetic radiation may be deflected and focused in a first direction, and a power of the electromagnetic radiation may be modulated according to the stored data. A guiding rail may be moved in the first direction and a carriage may be moved in a second direction, the first and second directions each may be one of a continuous and stepwise, and the second direction may be perpendicular or substantially perpendicular to the first direction. The pattern may be exposed on the workpiece.

An apparatus for exposing a workpiece according to another example embodiment of the present invention may include an optical system which may deflect and/or focus electromagnetic radiation in a first direction relative to the workpiece, and may modulate a power of the electromagnetic radiation in accordance with at least a portion of the data describing geometrical elements in a pattern. A guiding rail may include a carriage and may be capable of moving in at least a first direction in one of a continuous or stepwise manner. The carriage may be capable of moving in a second direction in one of a continuous or stepwise manner, and the first and second directions may be perpendicular or substantially perpendicular to each other. The workpiece may be kept at a fixed position during exposure.

An optical system according to another example embodiment of the present invention may include a modulator and a deflector. The modulator may vary at least one of an illumination time and an intensity of electromagnetic radiation emitted from a laser source. The deflector may deflect and/or relay the electromagnetic radiation toward a workpiece, for example, after the modulator varies at least one of the illumination time and the intensity of electromagnetic radiation. The deflected electromagnetic radiation may be usable to expose the workpiece.

An optical system according to another example embodiment of the present invention may include a beam splitter, at least one spatial light modulator, a first lens and a second lens. The beam splitter may partition a laser beam into a plurality of laser beams. The at least one spatial light modulator may include a plurality of pixels, may receive the plurality of laser beams and relay the plurality of laser beams toward a workpiece. The first lens may project the relayed plurality of laser beams onto a spatial filter, which may be adapted to block out at least a portion of the projected plurality of laser beams, and the second lens may form an image on the workpiece.

In example embodiments of the present invention, the data may be stored in at least one database and the deflecting and focusing may be performed by an optical head mounted on the carriage.

In example embodiments of the present invention, the modulating may be performed by at least one spatial light modulator positioned on the carriage. The at least one spatial light modulator may have a plurality of object pixels adapted to receive the electromagnetic radiation and relay the electromagnetic radiation toward the workpiece.

In example embodiments of the present invention, the workpiece may be positioned in a horizontal, substantially horizontal, vertical, or substantially vertical direction during exposure.

In example embodiments of the present invention, the laser may be fixed to or separate from the guiding rail, and/or the carriage may include a modulator for modulating the optical power.

In example embodiments of the present invention, a modulator for modulating the optical power may be arranged at a fixed distance from a laser source emitting the electromagnetic radiation.

In example embodiments of the present invention, the optical system may further include a deflector and/or a modulator. The deflector may deflect and/or focus the electromagnetic radiation in the first direction relative to the workpiece. The modulator may modulate the power of the electromagnetic radiation in accordance with the at least a portion of the data.

In example embodiments of the present invention, the modulator may include at least one spatial light modulator including a plurality of pixels, adapted to receive the electromagnetic radiation and relay the electromagnetic radiation toward the workpiece.

In example embodiments of the present invention, the electromagnetic radiation may be a laser beam and/or the optical system may further include a beam splitter, at least one spatial light modulator, a first and a second lens. The beam splitter may partition the laser beam into a plurality of laser beams. The at least one spatial light modulator may include a plurality of pixels, which may receive the plurality of laser beams and relay the plurality of laser beams toward the workpiece. The first lens may project the relayed plurality of laser beams onto a spatial filter, and the spatial may be adapted to block out at least a portion of the projected plurality of laser beams. The second lens may form an image on a workpiece.

DETAILED DESCRIPTION OF EXAMPLE EMBODIMENTS OF THE PRESENT INVENTION

The following detailed description is made with reference to the drawings, which illustrate example embodiments of the present invention. However, these example embodiments of the present invention are described to illustrate the present invention, not to limit its scope. Those of ordinary skill in the art will recognize a variety of equivalent variations on the description that follows.

Example embodiments of the present invention will be described with reference to an analogue spatial light modulator (SLM). However, it will be understood that any other suitable SLM may be used; for example, digital SLMs such as a digital micro-mirror device. Additionally, SLMs may include reflective and/or transmissive deflectable modulating elements (e.g., pixels, pixel elements, mirror elements, reflective elements, micro-mirrors, etc., any or all of which may be comprised of, for example, micronium or any suitable metal alloy).

Example embodiments of the present invention will be described with regard to an excimer laser source. However, it will be understood that any suitable radiation source (e.g., electromagnetic and/or pulsed electromagnetic radiation) such as a Nd-YAG laser, ion laser, Ti sapphire laser, free electron laser, any other pulsed fundamental frequency lasers, flash lamps, laser plasma sources, synchrotron light sources, etc., may be used.

Figure 1:
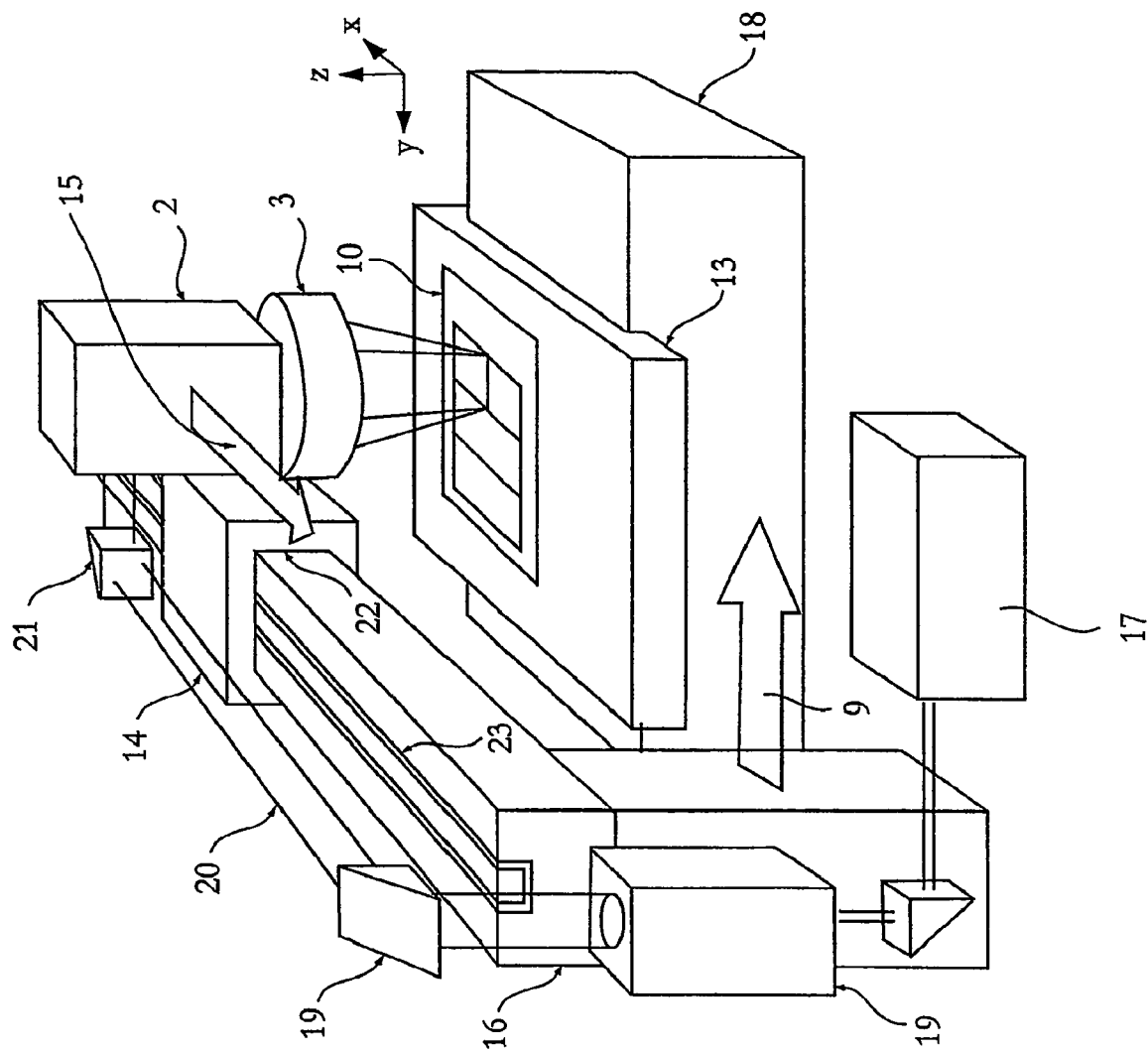
FIG. 1 illustrates an apparatus according to an example embodiment of the present invention.

As shown in FIG. 1, an apparatus according to an example embodiment of the present invention may include a support structure 13 capable of supporting a workpiece 10. A writing head including an optical system 2 for generating object pixels on the workpiece 10 and a final lens 3 may be placed on a carriage 14. The carriage 14 may slide along a guiding rail 16, for example, in an x-direction 15. Parts, which may move with the carriage 14, are shown hatched in FIG. 1. The guiding rail 16 may also move in a y-direction 9. In example embodiments of the present invention, the guiding rail 16 may move in a stepwise, or substantially stepwise, or a continuous or substantially continuous, fashion and/or the carriage 14 may move in a stepwise, or substantially stepwise, or a continuous, or substantially continuous, fashion. The stepwise movement may be, for example, a slower and the continuous motion may be, for example, a faster movement.

Alternatively, in example embodiments of the present invention, the workpiece 10 may be in a fixed, or substantially fixed, position while patterned, and the support structure 13 may be arranged on a damping structure (e.g., vibration damping structure) 18. The damping structure 18 may include, for example, a higher density material and may be supported by an air cushion, which may also damp vibrations.

As shown in FIG. 1, an end leg of the guiding rail 16 is omitted for visibility. The optical system 2 may generate a scan line, which may include, for example, several hundred pixels. The pixels may be written, for example, in the y-direction 9 for each x position along the guiding rail 16. A plurality of scan lines may form a strip, and a plurality of pattern strips may form a pattern. The pattern strips may or may not at least partly overlap each other, depending on the writing method.

Figure 2:
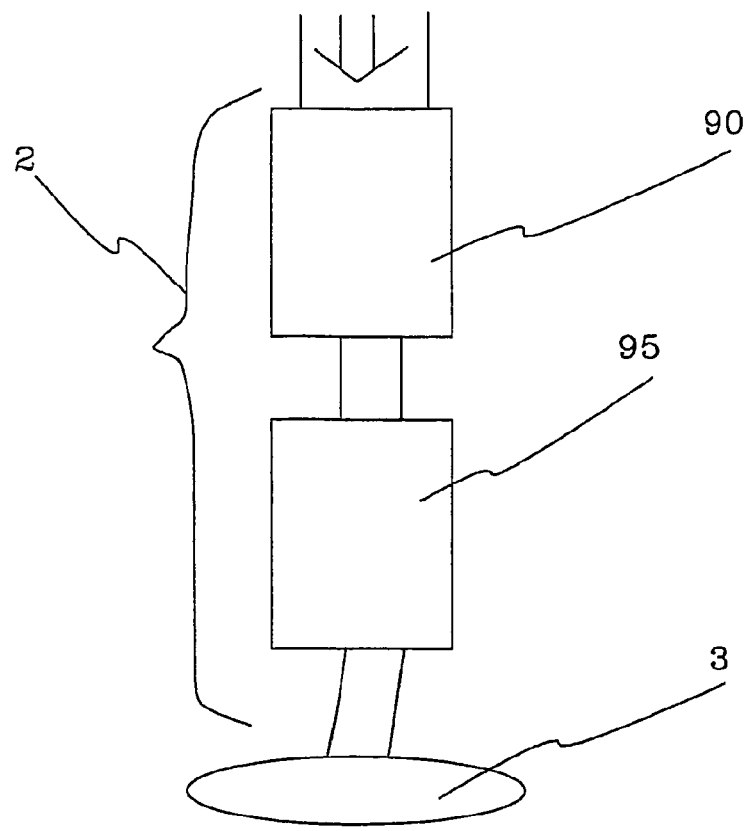
FIG. 2 illustrates an optical system according to an example embodiment of the present invention.

As illustrated in FIG. 2, the optical system 2 may include a modulator 90 and a deflector 95. The modulator 90 may change the period of illumination time and/or intensity of the electromagnetic radiation from the source 17, and may be, for example, a conventional modulator (e.g. acousto-optical modulator) or any other suitable modulator with similar, or substantially similar, functionality. The deflector 95 may deflect the beam of radiation for creating the pattern strips, and may be a conventional deflector (e.g., an acousto-optical deflector) or any other suitable deflector. The pixel clock connectable to the modulator may use a frequency of, for example, about 50 MHz; although any suitable frequency may be used. A length of the scan line, (e.g., a width of a strip) may be, for example, about 200 μm. In example embodiments of the present invention, the scan line may include, for example, about 800 pixels.

In another example embodiment of the present invention, the optical system 2 may include the deflector 95 and may not include the modulator 90. In this example embodiment, the modulator 90 may be arranged at a fixed position from the laser source 17.

Figure 3:
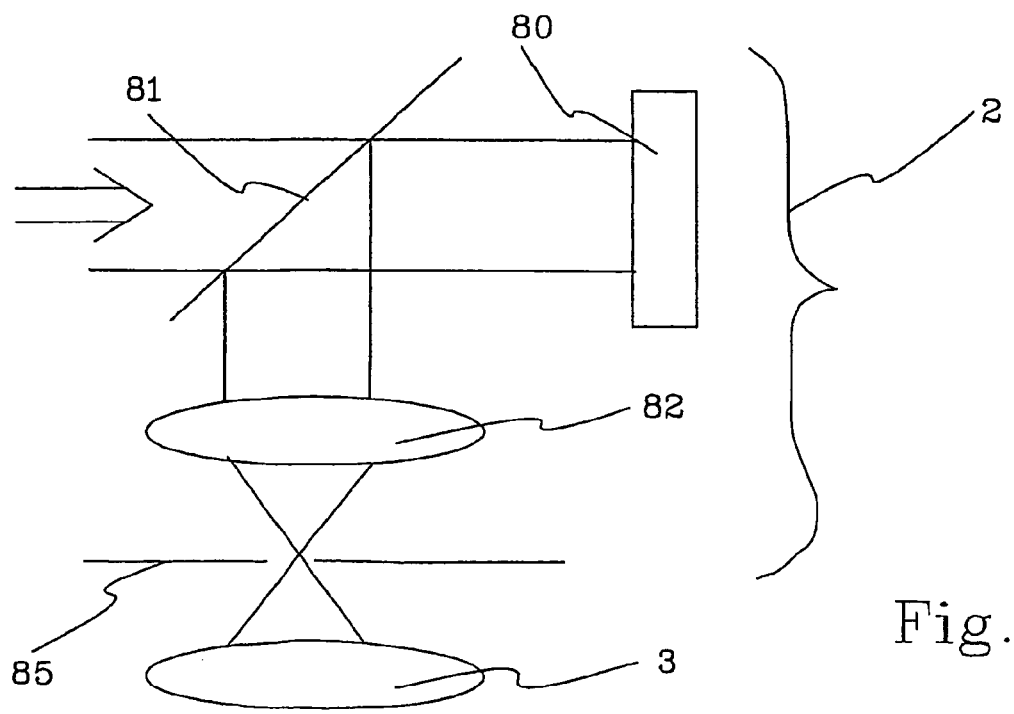
FIG. 3 illustrates an optical system according to another example embodiment of the present invention.

FIG. 3 illustrates an optical system, according to another example embodiment of the present invention. As illustrated in FIG. 3, the optical system 2 may include an SLM 80, a beam splitter 81, a tube lens (e.g., a compounded tube lens) 82 and a spatial filter 85. As shown in FIG. 3, the SLM 80 may be operated, for example, in an analog mode, and the tube lens 82 and the spatial filter 85 together may form a Fourier filter. The tube lens 82 may project the diffracted pattern onto the spatial filter 85 and the lens (e.g., a compounded final lens) 3, may form an image (e.g., an aerial image) on the workpiece 10.

The spatial filter 85 may be, for example, an aperture in a plate, which may be sized and/or positioned in order to suppress (e.g., block out) orders of diffraction (e.g., each diffraction order) greater than or equal to the first diffraction order. In one example, the aperture may be located at a focal distance from the tube lens 82, and reflected radiation may be collected by the tube lens 82 in a focal plane, which may also be a pupil plane of the final lens 3. In this example, the aperture may suppress (e.g., block out) the radiation from the first and higher diffraction orders from addressed pixels (e.g., micro-mirrors, etc.) in the SLM 80, while the radiation from the non-addressed pixels may pass the aperture. This may provide an intensity modulated image (e.g., aerial image) on the workpiece 10. In another example, for an image area with increasing darkness (e.g., optimum darkness) the diffraction pattern may contain radiation in the first and higher diffraction orders and may not contain radiation in the zeroth order.

In example embodiments of the present invention, the SLM 80 may build a pattern using, for example, stamps stitched together and which may at least partially overlap each other. A stamp may be an image of the SLM 80 at an image plane where the workpiece 10 may be arranged, and the pattern may be created using at least one exposure. If a plurality of exposures are used, stamps in a first exposure may be translated in at least one direction relative to stamps in a second exposure.

In an example embodiment of the present invention, the optical system 2 may include a plurality of SLM chips, which may be arranged next to each other, and which may have the same or different number of pixels and/or pixel geometrics.

In example embodiments of the present invention, radiation may be generated by a laser source 17, which may be positioned (e.g., fixed and/or mounted) on the guiding rail 16 or separated from the guiding rail 16. The radiation may be expanded, collimated, homogenized and emitted (e.g., launched) by an optical system 19 in a direction parallel, or substantially parallel, to the guiding rail 16, such that it may impinge pick-up optics 21 on the carriage 14, with unchanged, or substantially unchanged, lateral position, angle and/or cross section during movement along the guiding rail 16.

The laser source 17 may be a continuous, or substantially continuous, laser source and the optical system 2 may include a modulator and a deflector, for example, the modulator 90 and the deflector 95 of FIG. 2. If the laser source 17 is, for example, a pulsed excimer laser, the optical system 2 may include an SLM, for example, the SLM of FIG. 3, and the wavelength of the laser may be, for example, in the ultraviolet (UV), deep ultraviolet (DUV) or extreme ultra-violet (EUV) range. If the wavelength is in the EUV range, at least a portion (e.g., the majority) of the majority optics may be reflective rather than refractive.

Alignment of the guiding rail 16 with the workpiece may be performed, for example, using interferometers in a conventional manner known by the skilled artisan and therefore need not be further explained. The workpiece 10 may be translated in any suitable manner using, for example, piezoelectrical actuators arranged on at least one end of the support structure 13.

Figure 4:
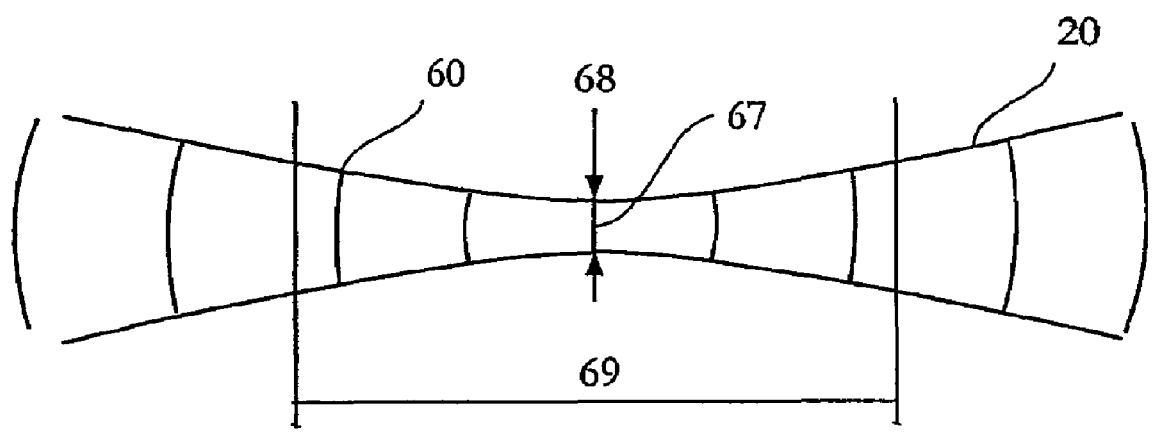
FIG. 4 illustrates example waist and wave fronts of a Gaussian laser beam according to example embodiments of the present invention.

FIG. 4 illustrates an example expansion of a beam before the beam may be launched toward the moving guiding rail 16 and carriage 14. A laser beam 20 having higher (e.g., suitable or good) quality may have a Gaussian waist 68 in which the diameter of the beam 20 may be reduced (e.g., a minimum). At the waist 68 the wave front 67 of the beam may be flat; however, wave fronts 60 of the beam away from the waist 68 may be curved. In example embodiments of the present invention, the wave fronts 60 may exist, for example, at any distance from the waist 68. The source distance may affect the true position of focus after the focusing lens 3. When the carriage 14 with the optical system 2 and the final lens 3 mounted thereon slides along the guiding rail 16, the curvature of the wave front 67 may be changed, such that a focus (e.g., a true focus) may be below the workpiece 10 and/or away from the laser source 17 and/or above the workpiece 10 at distances closer to the laser source 17. When the laser source 17 is not fixed to the guiding rail 16, the distance from the laser source 17 to the guiding rail 16 and the carriage 14 may be taken into account. The curvature variation may be determined, for example, by the wavelength and/or the diameter at the waist 68, and with an unexpanded laser beam the useful range 69 may be less than the mechanical stroke of the carriage 14 and/or the guiding rail 16. With a wider waist 68 produced after the beam expander 19 the wave front may be flatter, for example, at each wave front, the focus shift may be smaller and/or the useful range may be larger than the mechanical stroke of the guiding rail 16 and the carriage 14 together.

In the example embodiment of the present invention as illustrated in FIG. 1, for example, the workpiece 10 may be arranged in parallel, or substantially parallel, with an x-y plane. This x-y plane may be a horizontal, or substantially horizontal, plane or a vertical, or substantially vertical, plane. If the x-y plane is a vertical, or substantially vertical, plane, the workpiece 10 may be a standing substrate. Example embodiments of the present invention may occupy a reduced amount of surface area in a clean room (e.g., footprint). For example, with a standing substrate 10, the substrate may be less sensitive to contamination, for example, since an exposed area vulnerable to falling particles may be reduced (e.g., substantially reduced). In example embodiments of the present invention, the substrate may also be inclined at any angle between about 0° and about 90° from the horizontal plane.

Sag is a deformation of the workpiece due to a substrates weight. A pattern of sag may depend on the type of structures supporting the substrate, the number of support structures, the size and/or geometry of the substrate.

In example embodiments of the present invention, a stepping motor, a linear motor, air bearings, and/or any other suitable device may move the guiding rail 16. For example, a bearing may be positioned under each leg of the guiding rail 16.

In another example embodiment of the present invention (e.g., as shown in FIG. 4), the legs of the guiding rail 16 may be coupled to each other and may form a frame structure. This frame structure may include an upper part on which the carriage 14 may move in the x-direction and a lower part including bearings along the y-direction. The lower part may be below the damping structure 18, for example, a hollow part of the frame structure may move over the workpiece having the upper part above the workpiece 10 and the lower part below the workpiece 10.

In example embodiments of the present invention, mechanical and/or electronic servos on the guiding rail 16 or the support structure 13 may be used for positioning (e.g., fine positioning).

In an example embodiment of the present invention, there may be a plurality of motors (e.g., two linear motors) operating on the guiding rail 16 for performing movement in the y-direction, and the linear motors may perform positioning by rotating the guiding rail 16. The rotation may be limited by the bearing(s) attached to the guiding rail 16 for movement in the y-direction.

At an end support of the support structure 13 actuators (e.g., piezoelectric actuators) may be attached displacing the support structure 13 in the y-direction. The actuators may be driven by voltages (e.g., analog voltages) from a control system including, for example, interferometers and/or a feedback circuits sensing the position of the support structure 13 relative to that of the guiding rail 16 by interferometry. The actuators may correct the limited resolution in the stepping motor and/or non-straight travel over the guiding rail 16. Each actuator may have a movement range of, for example, about 100 μm.

The guiding rail 16 may also be adjusted to compensate for the resolution (e.g., limited resolution) of the motor (e.g., stepping or linear motor). In a similar manner actuators may be attached to the guiding rail 16 and using interferometry, for example, the position of the support structure 13 relative to the guiding rail 16 may be monitored (e.g., constantly).

In example embodiments of the present invention (e.g., as illustrated in FIG. 1) the carriage 14 may slide on bearings 22 along the guiding rail 16. The carriage 14 may be driven by a motor (e.g., linear electric motor) 23 and may not contact (e.g., physically contact) the guiding rail 16 other than through electric cables and/or air supply tubes. The carriage 14 may be moved using the contact-less motor 23 and/or inertia.

Calibration may be used to compensate for errors concerning the straightness of the guiding rail 16. For example, after the machine is assembled a test plate may be written and the writing errors measured. The writing errors may be stored in a calibration file and fed to the control system as compensation during subsequent writing.

In example embodiments of the present invention, the deflector 95 in the optical system 2, which may be mounted above (e.g., immediately above) the lens 3 may be used to form scan lines. Pixels may be, for example, about 300 nm×300 nm and each scan line may be, for example, about 200 μm wide. In example embodiments of the present invention, the lens 3 may be, for example, a flat-field corrected lens with a numerical aperture less than or equal to about 0.14, and a focal length of, for example, about 4 mm.

Positioning (e.g., fine positioning) in the x-direction may be based on the timing of a start-of-scan pulse when the lens 3 is at a first (e.g., correct) position. In the y-direction the mechanical servos described above may be supplemented by a data delay, which may move data along the acousto-optical scan. Example embodiments of the present invention may provide an inertia-free feed forward control system having increased bandwidth of the position control to, for example, greater than, or equal to, about 100 Hz.

Angle deviations from stroke to stroke of the carriage 14 may be, for example, less than about 10 micro radians, and there may not be any focus shift along the stroke. In example embodiments of the present invention, the carriage 14 may slide on bearings (e.g., air bearings) with a higher stiffness, and a position of the carriage 14 relative to the guiding rail 16 may be defined and/or independent of external air pressure and/or temperature. An imperfect guiding rail 16 may result in a writing error along the scan line. However, this error may be measured during calibration, stored as a correction curve and fed to the position feed back system for compensation during, for example, subsequent writing. Focus may be kept constant, or substantially constant, by manipulating the laser beam via collimating and/or beam shaping optics 19.

When using an optical system according to example embodiments of the present invention (e.g., as shown in FIGS. 2 and/or 3), a laser beam may be split into a plurality of beams using a beam splitter (not shown).

Example embodiments of the present invention provide a writer capable of writing for patterns of, for example, about 1900 mm×1200 mm, about 2100 mm×1500 mm or any other suitable size. The damping structure may be formed by granite block and may be larger, or substantially larger, in size than the pattern to be written.

In example embodiments of the present invention a database describing geometrical elements in a pattern may be included in or separate from an apparatus for patterning a workpiece.

While example embodiments of the present invention have been described by reference to the drawings, it will be understood that these and other example embodiments are intended in an illustrative rather than limiting. It will also be understood that modifications and/or combinations will readily occur to the skilled artisan, which modifications and/or combinations will be within the spirit of the present invention and the scope of the following claims.

The invention claimed is:

1. A method for writing a pattern on a workpiece, comprising:
   providing a support structure holding the workpiece;
   emitting electromagnetic radiation toward the workpiece;
   storing data describing geometrical elements in the pattern;
   deflecting and focusing the electromagnetic radiation in a first direction relative to the workpiece;
   modulating a power of the electromagnetic radiation according to the stored data;
   moving a guiding rail in the first direction in a continuous or stepwise manner relative to the position of the support structure holding the workpiece, and moving a carriage along the guiding rail and in a second direction in a continuous or stepwise manner relative to the position of the support structure, the second direction being substantially perpendicular to the first direction, wherein an optical head used for writing the pattern on the workpiece is mounted on the movable carriage; and
   exposing the pattern on the workpiece; wherein
   the workpiece is kept at a fixed position during exposure.

2. The method of claim 1, wherein,
   the data is stored in at least one database, and
   the deflecting and focusing is performed by an optical system mounted on the carriage.

3. The method of claim 1, wherein the modulating is performed by at least one spatial light modulator positioned on the carriage, and having a plurality of object pixels adapted to relay the electromagnetic radiation toward the workpiece.

4. The method of claim 1, wherein the workpiece is positioned in a vertical, substantially vertical, horizontal, or substantially horizontal direction during exposure.

5. The method of claim 1, wherein a laser is fixed to the guiding rail.

6. The method of claim 1, wherein a laser is separate from the guiding rail.

7. The method of claim 1, wherein the carriage includes a modulator for modulating the optical power.

8. The method of claim 1, wherein a modulator for modulating the optical power is arranged at a fixed distance from a laser source emitting the electromagnetic radiation.

9. An pattern generator for writing a pattern on a workpiece, comprising:
   a support structure configured to hold the workpiece;
   an optical system adapted to deflect and focus electromagnetic radiation in a first direction relative to the workpiece, and adapted to modulate a power of the electromagnetic radiation in accordance with at least a portion of data describing geometrical elements in the pattern;

a guiding rail capable of moving in at least a first direction in one of a continuous or stepwise manner relative to the position of the support structure holding the workpiece, the guiding rail including a carriage capable of moving in a second direction in one of a continuous or stepwise manner relative to the position of the support structure, the first and second directions being perpendicular or substantially perpendicular to each other; wherein an optical head used for writing the pattern on the workpiece is mounted on the movable carriage, and the workpiece is kept at a fixed position during exposure.

10. The apparatus of claim 9, wherein the electromagnetic radiation includes at least one laser beam.

11. The apparatus of claim 9, wherein the workpiece is positioned in a vertical, substantially vertical, horizontal or substantially horizontal direction during exposure.

12. The apparatus of claim 9, wherein a laser is fixed to the guiding rail.

13. The apparatus of claim 9, wherein at least one laser is separated from the guiding rail.

14. The apparatus of claim 9, wherein the modulator is arranged at a fixed distance from a source of the electromagnetic radiation.

15. The apparatus of claim 9, wherein the optical system further includes, a deflector adapted to deflect and focus the electromagnetic radiation in the first direction relative to the workpiece, and a modulator adapted to modulate the power of the electromagnetic radiation in accordance with at least a portion of the data.

16. The apparatus of claim 15, wherein the modulator includes at least one spatial light modulator including a plurality of pixels, adapted to receive the electromagnetic radiation and relay the electromagnetic radiation toward the workpiece.

17. The apparatus of claim 9, wherein the electromagnetic radiation is a laser beam and the optical system further includes, a beam splitter adapted to partition the laser beam into a plurality of laser beams;

at least one spatial light modulator including a plurality of pixels, adapted to receive the plurality of laser beams and relay the plurality of laser beams toward the workpiece;

a first lens adapted to project the relayed plurality of laser beams onto a spatial filter, the spatial filter being adapted to block out at least a portion of the projected plurality of laser beams; and a second lens adapted to form an image on the workpiece.

18. The apparatus of claim 9, wherein the optical system includes:

a modulator adapted to vary at least one of an illumination time and an intensity of electromagnetic radiation emitted from a laser source; and a deflector adapted to deflect the electromagnetic radiation toward a workpiece after the modulator varies at least one of the illumination time and the intensity of electromagnetic radiation, the deflected electromagnetic radiation usable to expose the workpiece.

19. The apparatus of claim 9, wherein the optical system includes:

a beam splitter adapted to partition a laser beam into a plurality of laser beams;

at least one spatial light modulator including a plurality of pixels, adapted to receive the plurality of laser beams and relay the plurality of laser beams toward a workpiece;

a first lens adapted to project the relayed plurality of laser beams onto a spatial filter, the spatial filter being adapted to block out at least a portion of the projected plurality of laser beams; and a second lens adapted to form an image on the workpiece.

20. An apparatus for performing the method of claim 1.

* * * * *